United States Patent
Tsukamoto et al.

(10) Patent No.: US 7,829,354 B2
(45) Date of Patent: Nov. 9, 2010

(54) METHOD OF FUSING TRIMMING FOR SEMICONDUCTOR DEVICE

(75) Inventors: Akiko Tsukamoto, Chiba (JP); Jun Osanai, Chiba (JP)

(73) Assignee: Seiko Instruments Inc. (JP)

( * ) Notice: Subject to any disclaimer, the term of this patent is extended or adjusted under 35 U.S.C. 154(b) by 260 days.

(21) Appl. No.: 12/069,472

(22) Filed: Feb. 11, 2008

(65) Prior Publication Data
US 2008/0248601 A1 Oct. 9, 2008

(30) Foreign Application Priority Data
Feb. 13, 2007 (JP) ............................. 2007-032032

(51) Int. Cl.
H01L 21/66 (2006.01)
H01L 31/26 (2006.01)
H01L 21/82 (2006.01)
H01L 21/326 (2006.01)
H01L 21/479 (2006.01)

(52) U.S. Cl. ........................... 438/14; 438/17; 438/132; 438/467

(58) Field of Classification Search ................. 438/467, 438/601, 132, 215, 281, 333, 14, 17
See application file for complete search history.

(56) References Cited

U.S. PATENT DOCUMENTS 4,531,842 A * 7/1985 Schonberger .................. 374/1
7,084,695 B2 * 8/2006 Porter ........................ 327/512

FOREIGN PATENT DOCUMENTS

JP 05013670 1/1993

* cited by examiner

Primary Examiner—Chuong Anh Luu
(74) Attorney, Agent, or Firm—Adams & Wilks

(57) ABSTRACT

Deviation occurring in a particular region in a plane of a resistor group which constitutes a semiconductor integrated circuit is improved and a quick increase in yield is accomplished. Provided is a fuse trimming method for a semiconductor device in which circuit elements such as transistors and resistors are formed on a semiconductor wafer and which has fuse elements capable of adjusting a resistance value of the resistors by laser trimming, including a resistor correction step of correcting in the particular region of the semiconductor wafer the resistance value of the resistors based on an amount of deviation from a target value of the resistance value of the resistors.

4 Claims, 4 Drawing Sheets

Prior Art

METHOD OF FUSING TRIMMING FOR SEMICONDUCTOR DEVICE

BACKGROUND OF THE INVENTION

1. Field of the Invention

The present invention relates to a method of manufacturing a semiconductor device, and more particularly, to trimming of a resistor.

2. Description of the Related Art

In general, laser trimming is performed to adjust the target value of the circuit in analog ICs by matching the resistance value with its intended value.

FIG. 2 is a schematic diagram of a resistor group and fuse elements according to a conventional art.

After two-dimensional patterning of integrated circuits on a semiconductor wafer, electric characteristic of each IC is measured for the whole wafer. From the measured value, a resistance value necessary to output a target value assigned to the circuit is calculated, and trimming cut data is created such that a resistor group 203 in the IC exhibits the necessary resistance value. The resistor group 203 is constructed of resistors 202 which are selectively combined through cutting the fuse elements 201 made from polycrystalline silicon film by laser beam irradiation or the like. The resistors 202 are often made of polycrystalline silicon. Based on the trimming cut data, some of the fuse elements 201 provided in a portion of interconnecting lines are selected to be irradiated with a laser beam and cut off. Laser trimming shown above adjusts the resistance value of the resistor group 203 to a desired value.

Even when laser trimming as the one described above is carried out, however, a problem occurs in which the resistance value of the entire resistor group does not match the calculated resistance value if the relative accuracy differs from one resistor to another. The defect can be a factor for low yield when the IC is actually manufactured. If the cause of the defect is attributed to the polycrystalline silicon resistors formation, the wafer manufacturing process needs to be reviewed. If the cause is attributed to the constituent circuit itself, the circuit needs a modification and a new photomask for producing the IC has to be made. Solving the problem by these methods need some time and money, and are not considered very effective for early resolution for low yield. In addition some increase in cost results in.

An instance of the defect is that the relative accuracy falls in a particular section (region) within a wafer while deviation in relative accuracy occurs always in the same section. FIG. 3 shows an example of a case in which the particular section is a fan-shaped region. Sometimes, a quick action toward the resolution of the defect is required despite difficulties in identifying the cause of the defect only suspected to be in the wafer manufacturing process.

SUMMARY OF THE INVENTION

The present invention has been made to solve the above defect, and an object of the present invention is therefore to provide a solution to the defect.

To attain the above object, deviation in relative accuracy throughout the wafer surface is eliminated by giving the relative accuracy in the particular section (region) alone a coefficient that makes the relative accuracy in the particular region closer to the one in other regions.

(1) The present invention provides a fuse trimming method for a semiconductor device including a semiconductor integrated circuit in which circuit elements such as transistors and resistors are formed on a semiconductor wafer and which includes fuse elements capable of adjusting a resistance value of the resistors by laser trimming, including a resistor correction step of correcting the resistance value of the resistors based on resistance value information of the resistors.

(2) In the fuse trimming method for a semiconductor device, the resistor correction step includes the steps of: conducting a first electric characteristic test on a semiconductor device that is formed on a first semiconductor wafer; calculating trimming data from data of the first electric characteristic test; using the trimming data to cut off a fuse in the semiconductor device formed on the first semiconductor wafer; conducting a second electric characteristic test on the semiconductor device from which the fuse has been cut; calculating relative accuracy from data of the second electric characteristic test; dividing the first wafer into a region that has a semiconductor device with similar relative accuracy and a different region that has a semiconductor device with significantly different relative accuracy, and calculating a mean relative accuracy of each region; calculating a correction coefficient for each region from the mean relative accuracy of each region; conducting the first electric characteristic test on a semiconductor device that is formed on a second semiconductor wafer; calculating trimming data based on the correction coefficient of each region in addition to the data of the first electric characteristic test of the semiconductor device formed on the second semiconductor wafer; and using the correction coefficient of each region in addition to the second trimming data to cut off a fuse in the semiconductor device formed on the second semiconductor wafer.

(3) In the fuse trimming method for a semiconductor device, the first semiconductor wafer is a first wafer in a wafer lot, and the second semiconductor wafer is one of a second and subsequent semiconductor wafers in the wafer lot.

(4) In the fuse trimming method for a semiconductor device, the first semiconductor wafer includes first several wafers in a wafer lot, and the second semiconductor wafer includes a semiconductor wafer that follows the first semiconductor wafer in the wafer lot.

(5) In the fuse trimming method for a semiconductor device, the first semiconductor wafer and the second semiconductor wafer constitute different wafer lots.

The location of a particular section (region) where there is a deviation in relative accuracy and the amount of the deviation is obtained in advance, and a correction coefficient calculated from the deviation amount is used only in the particular section to correct the relative accuracy of the particular section. The deviation in relative accuracy throughout the wafer surface is thus eliminated and an improvement in yield is expected. It is also a quick and simple resolution of the deviation in relative accuracy throughout the wafer without modification/improvement of the wafer manufacturing process and circuits constituting an IC.

DETAILED DESCRIPTION OF THE PREFERRED EMBODIMENTS

Given below is a description of the best mode for carrying out the present invention.

Figure 1:
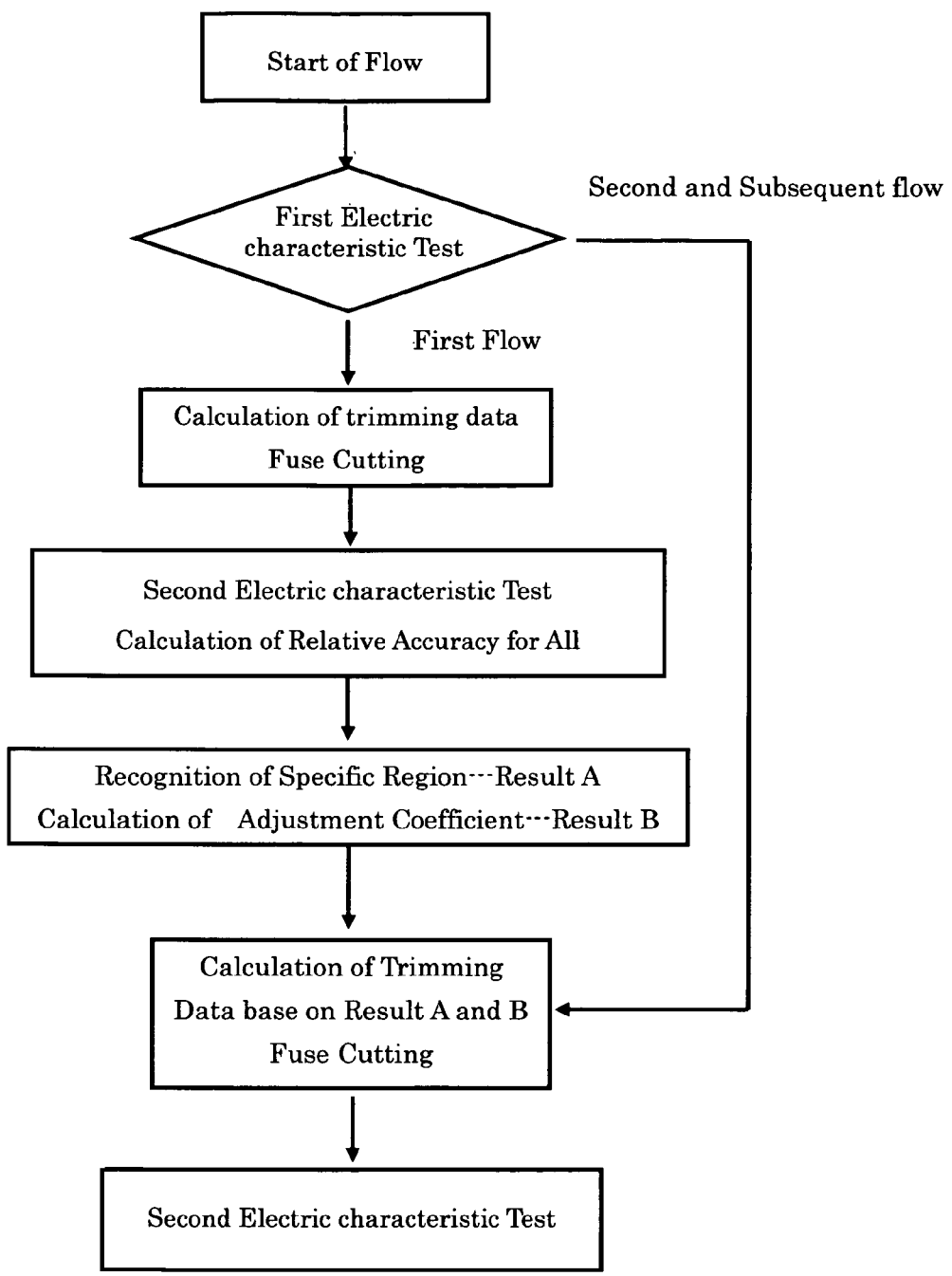
FIG. 1 is a flowchart showing a first embodiment of the present invention.
Figure 2:
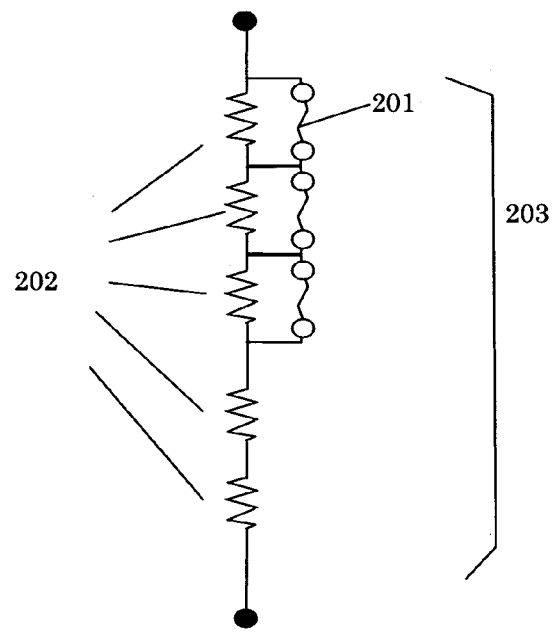
FIG. 2 is a diagram schematically showing a resistor group and fuse elements according to a related art.
Figure 3:
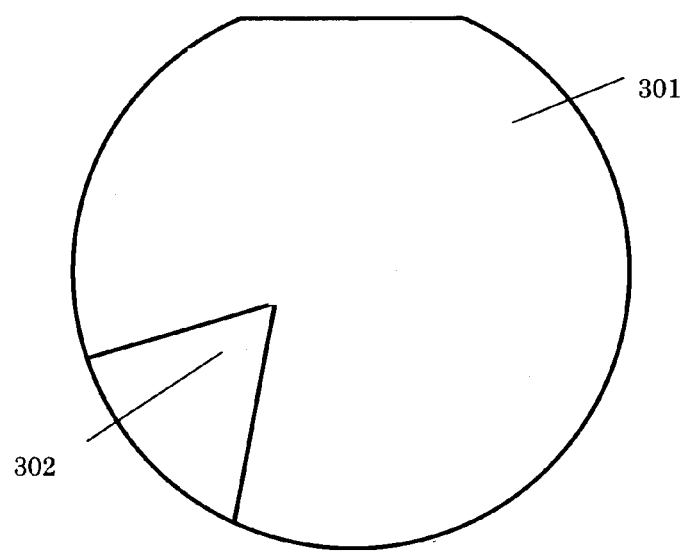
FIG. 3 is an auxiliary diagram illustrating a "particular section (region)"

A first embodiment of the present invention is described with reference to FIG. 1.

The first flow for investigation is conducted as follows:

First, the electric characteristic of every IC on the wafer is measured to locate a particular section (region) in the whole wafer surface where a defect occurs. "Defect" here means deviation of a characteristic value from tolerance allowed for characteristic values for which matching by trimming can be conducted. Any measurement method can be employed as long as the distribution of relative accuracy values throughout the wafer surface is obtained. For example, in the case of a voltage regulator, a switching regulator, or the like which has an output of a desired voltage through a resistor group, the output voltage which is a characteristic value of an output transistor constituting a circuit is measured in advance in order to calculate the relative accuracy from the measured output voltage. By performing the measurement and calculation on every IC on the wafer surface, location of the particular section (region) in the wafer surface can be obtained for each IC with the IC size as a unit length. Accordingly it is necessary to obtain the location of the particular section (region) in terms of wafer coordinates as well.

Figure 4A:
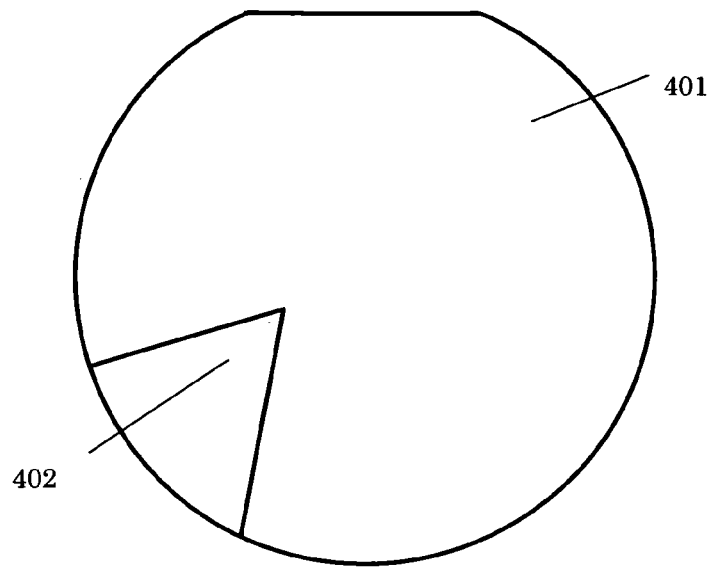
FIGS. 4A and 4B are auxiliary diagrams illustrating the particular section (region) in the first embodiment.
Figure 4B:
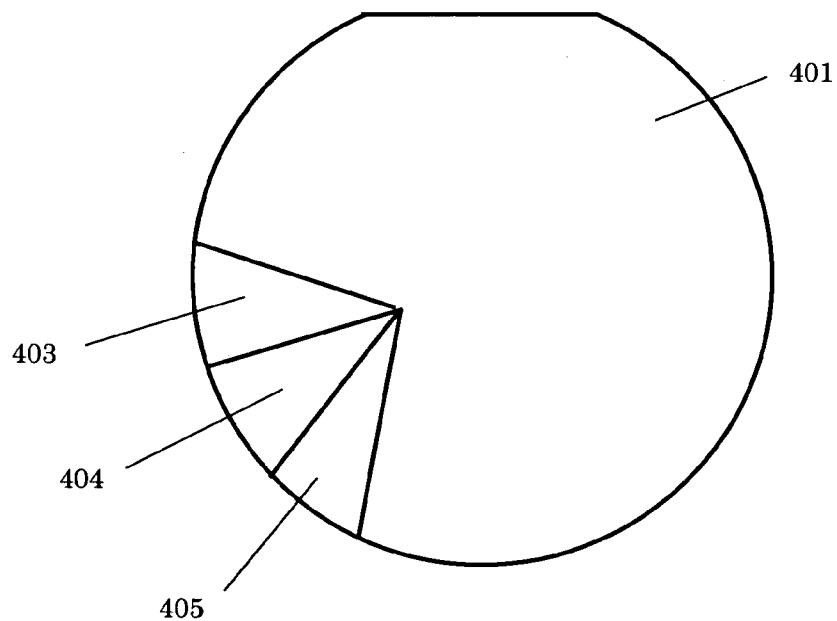

Next, a coefficient is calculated from the relative accuracy value calculated above. To give an example, it is assumed in FIG. 4A that the value distributed in the particular section (region) 402 uniformly has a relative accuracy that is X times the relative accuracy of the rest of the wafer (will be referred to the other region 401). Coefficient Y is the reciprocal of X, and calculated by $Y=1/X$. In calculating the coefficient, one coefficient can be used for representing the particular section (region) 402, or different correction coefficients can be used for multiple sections (regions) as shown in FIG. 4B for example in which a correction coefficient a is given to a section (region) 403, a correction coefficient b is given to a section (region) 404, and a correction coefficient c is given to a section (region) 405. It is also possible to divide the particular section (region) 402 by correction coefficient, for example, into the section (region) 403 where the correction coefficient $a=1.5$, the section (region) 404 where the correction coefficient $b=1.7$, and the section (region) 405 where the correction coefficient $c=1.8$. Alternatively, a mean value of correction coefficients of the distributed particular sections (regions) may be used as a correction coefficient for the particular sections (regions).

The next step is to create a measurement program that reflects the calculated coefficient only to the particular section (region) 402 (or 403 to 405). For that reason, it is necessary to obtain in the above examination the location of the particular section (region) 402 (or 403 to 405) in terms of wafer coordinates as well. Trimming cut data of a resistor group is then calculated such that a desired voltage can be obtained based on the first electric characteristic data which has been measured for the whole wafer. In the calculation of the trimming cut data according to the first embodiment, a target value set for the resistor group is multiplied by the coefficient Y to correct the trimming cut data. This correction is made only in the above particular section (region), and not in other regions. The timing to make the correction may be changed to suit individual circumstances and testing methods employed. The deviation in relative accuracy in the particular section (region) is solved by executing this correction method.

Based on the trimming cut data, the second flow for examination is conducted. In the second flow, trimming cut is performed according to the above data to make the resistance value of the resistor group match the target value. Preferably, the first flow is performed on the first wafer of the wafer lot while the second flow is performed on the second and subsequent wafers. Alternatively, the first flow may be performed on multiple wafers of the wafer lot while the second round may be performed on a wafer that follows the multiple wafers.

Figure 5:
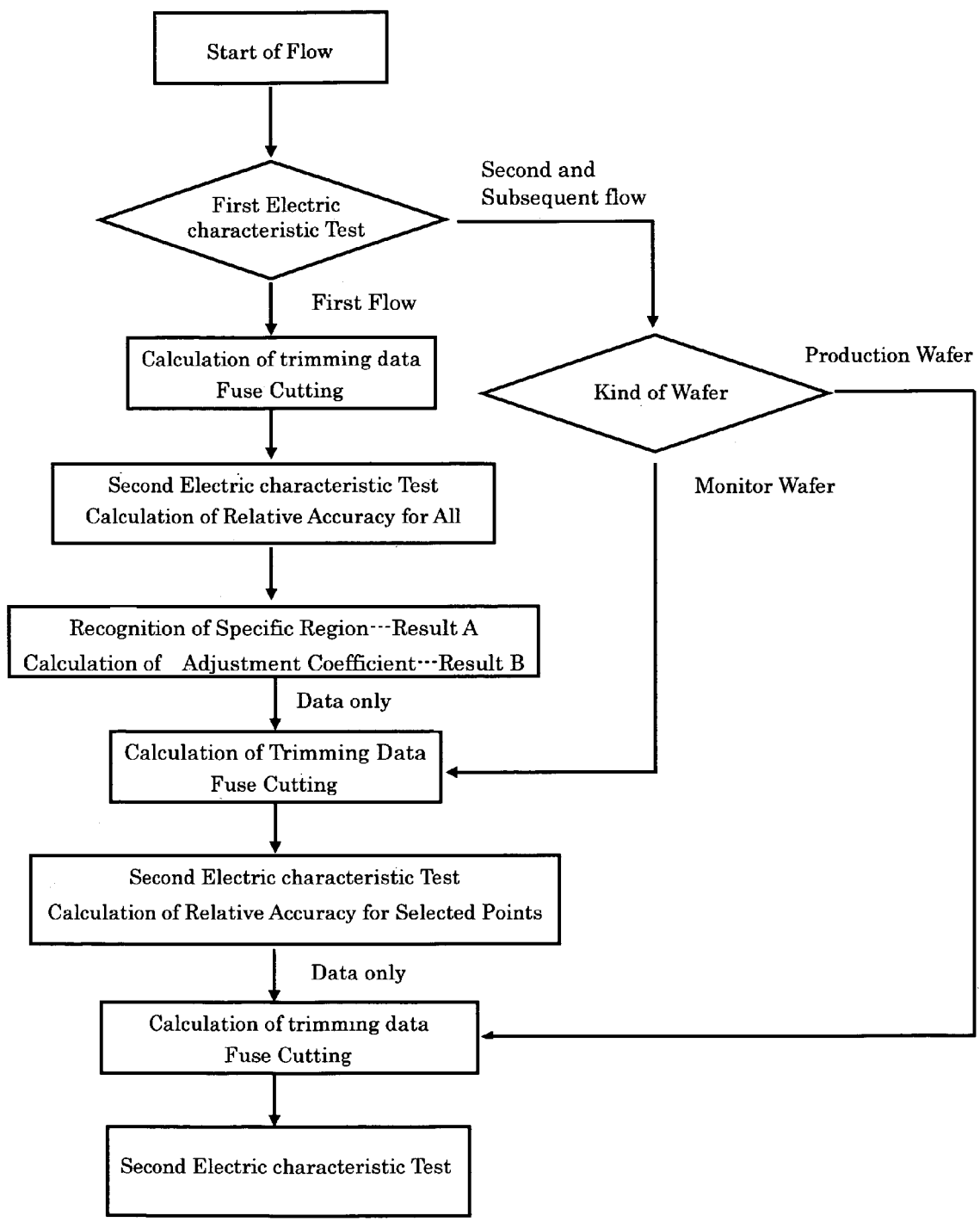
FIG. 5 is a flowchart showing a second embodiment of the present invention.

A second embodiment is described with reference to FIG. 5.

A relative accuracy correction method in the second embodiment takes the similar form as the one in the first embodiment. In the second embodiment, the correction is made on each lot in mass production of the IC. This method is more complicated and laborious than the one in the first embodiment, but provides more stable relative accuracy especially to products in which deviation in relative accuracy fluctuates from lot to lot.

First, as in the first embodiment, the first electric characteristic test is conducted and trimming data is calculated to cut off a fuse. In a particular section (region) including defect, the relative accuracy is corrected for a second electric characteristic test, and the correction coefficient Y and the coordinates of the particular section (region) are determined. This constitutes the first flow.

Next, in mass production of the IC, the second and subsequent flows use a monitor wafer to measure the first electric characteristic and calculate the coefficient as in the first embodiment. In this calculation, the relative accuracy is calculated only in the particular section (region) and at a few points (representative points) in the other section (region) because calculating the relative accuracy in every IC in the wafer surface takes time and costs money. The correction coefficient in the lot in question is thus re-calculated. The monitor wafer used must be a wafer on which semiconductor devices having the same semiconductor integrated circuits have been created by the same process at the same time as the products to be corrected.

Prior to the next step, a measurement program that makes the calculated coefficient is reflected only on the particular section (region) is created. The correction coefficient for the lot in question is thus reflected on trimming cut data as necessary, and the deviation in relative accuracy can be corrected with the data of the representative points even when the deviation in relative accuracy fluctuates greatly from lot to lot. Trimming cut is performed on wafers for sale according to the above trimming cut data to make the resistance value of the resistor group match its target value. In the manner described above, the deviation in relative accuracy throughout the wafer surface is eliminated and improvement in yield can be attained.

What is claimed is:

1. A fuse trimming method for a semiconductor device in which circuit elements such as transistors and resistors are formed on a semiconductor wafer and which includes fuse elements capable of adjusting a resistance value of the resistors by laser trimming, the fuse trimming method comprising:

a resistor correction step of correcting in a particular region of the semiconductor wafer the resistance value of the resistors based on an amount of deviation from a target value of the resistance value of the resistors, the resistor correction step comprising the steps of:

conducting a first electric characteristic test on a semiconductor device that is formed on a first semiconductor wafer;
calculating first trimming data from data of the first electric characteristic test;
using the first trimming data to cut off a fuse in the semiconductor device formed on the first semiconductor wafer;
conducting a second electric characteristic test on the semiconductor device from which the fuse has been cut;
calculating relative accuracy from data of the second electric characteristic test;
dividing the first wafer into a first region that has a semiconductor device whose relative accuracy is within tolerance and a second region that has a semiconductor device whose relative accuracy is outside the tolerance, and calculating a mean relative accuracy of each of the first region and the second region;
calculating a correction coefficient for each region from the mean relative accuracy of each of the first region and the second region;
conducting the first electric characteristic test on a semiconductor device that is formed on a second semiconductor wafer;
calculating second trimming data based on the correction coefficient of each of the first region and the second region in addition to the data of the first electric characteristic test of the semiconductor device formed on the second semiconductor wafer; and
using the second trimming data to cut off a fuse in the semiconductor device formed on the second semiconductor wafer.

2. A fuse trimming method for a semiconductor device according to claim 1; wherein the first semiconductor wafer comprises a first wafer in a wafer lot, and the second semiconductor wafer comprises one of a second wafer and subsequent semiconductor wafers in the wafer lot.

3. A fuse trimming method for a semiconductor device according to claim 1; wherein the first semiconductor wafer comprises the first several wafers in a wafer lot, and the second semiconductor wafer comprises a semiconductor wafer that follows the first semiconductor wafer in the wafer lot.

4. A fuse trimming method for a semiconductor device according to claim 1; wherein the first semiconductor wafer and the second semiconductor wafer constitute different wafer lots.

* * * * *